(12) United States Patent
Mulligan et al.

(10) Patent No.: US 8,449,238 B2
(45) Date of Patent: May 28, 2013

(54) IN-LINE FURNACE CONVEYORS WITH INTEGRATED WAFER RETAINERS

(75) Inventors: William P. Mulligan, San Jose, CA (US); Thomas Pass, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 1574 days.

(21) Appl. No.: 11/545,906

(22) Filed: Oct. 11, 2006

(65) Prior Publication Data
US 2008/0089773 A1    Apr. 17, 2008

(51) Int. Cl.
*B66C 17/08*    (2006.01)
(52) U.S. Cl.
USPC ...................................... 414/157; 198/803.14
(58) Field of Classification Search
USPC .................. 414/147, 157, 211; 198/803.14
See application file for complete search history.

(56) References Cited

U.S. PATENT DOCUMENTS

| | | | |
|---|---|---|---|
| 2,888,127 A * | 5/1959 | Uhlig | 198/379 |
| 3,044,601 A * | 7/1962 | Ellis | 198/803.13 |
| 4,976,612 A | 12/1990 | Adams | |
| 5,387,265 A | 2/1995 | Kakizaki et al. | |
| 5,779,797 A | 7/1998 | Kitano | |
| 5,921,773 A | 7/1999 | Lee | |
| 6,267,587 B1 * | 7/2001 | Bishop et al. | 432/121 |
| 6,360,866 B1 * | 3/2002 | Chiba et al. | 198/803.14 |
| 6,575,739 B1 | 6/2003 | Yoo | |
| 7,068,925 B2 | 6/2006 | Bayne | |
| 2006/0183307 A1 * | 8/2006 | Rohatgi et al. | 438/563 |
| 2006/0246683 A1 * | 11/2006 | Pan et al. | 438/424 |
| 2008/0012499 A1 * | 1/2008 | Ragay et al. | 315/113 |

OTHER PUBLICATIONS

PCT International Search Report for Application No. PCT/US07/19354 (2 sheets).

* cited by examiner

*Primary Examiner* — Joshua Rudawitz
(74) *Attorney, Agent, or Firm* — Okamoto & Benedicto LLP

(57) ABSTRACT

In one embodiment, an in-line furnace includes a continuous conveyor configured to hold wafers at an angle relative to ground. The conveyor may have fixedly integrated wafer retainers configured to hold the wafers in slots. The conveyor may be formed by several segments that are joined together. Each of the segments may include a base and a set of wafer retainers formed thereon. The conveyor may be driven to move the wafers through a chamber of the furnace, where the wafers are thermally processed.

7 Claims, 8 Drawing Sheets

IN-LINE FURNACE CONVEYORS WITH INTEGRATED WAFER RETAINERS

BACKGROUND OF THE INVENTION

1. Field of the Invention

The present invention relates generally to semiconductor wafer processing equipment, and more particularly but not exclusively to in-line furnaces.

2. Description of the Background Art

Wafer processing furnaces are employed in the fabrication of semiconductor devices, including integrated circuits and solar cells. Examples of fabrication processes where furnaces are employed include diffusion and annealing. In an in-line furnace, wafers to be processed are placed on wafer boats, which in turn are placed on a conveyor that carries the boats from one end of the furnace to another. After the boats have gone through the furnace, the boats are lifted off the conveyor and the processed wafers are removed from the boats. In some in-line furnaces that do not use boats, the wafers are placed flat on the conveyor during processing.

Embodiments of the present invention provide improved techniques for efficiently transporting wafers through an in-line furnace.

SUMMARY

In one embodiment, an in-line furnace includes a continuous conveyor configured to hold wafers at an angle relative to ground. The conveyor may have fixedly integrated wafer retainers configured to hold the wafers in slots. The conveyor may be formed by several segments that are joined together. Each of the segments may include a base and a set of wafer retainers formed thereon. The conveyor may be driven to move the wafers through a chamber of the furnace, where the wafers are thermally processed.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Many solar companies use in-line furnaces where wafers are placed flat on the conveyor. Relative to batch furnaces, in-line furnaces have the advantage of continuous processing suitable for high volume manufacturing. Additionally, each wafer sees the exact same thermal profile, unlike in a batch furnace where temperature uniformity across the tube can be an issue. Relative to in-line furnaces with wafers lying flat on the conveyor, in-line furnaces with wafers oriented vertically, such as in embodiments of the present invention or for boats on conveyors, have the advantage of higher wafer area output for the same belt speed, which allows much shorter furnaces. For example, 10 cm×10 cm wafers (100 cm² area) gapped by 1 cm on a continuous conveyor running at 11 cm/min will process 1 wafer/min (100 cm²/min) when placed flat on the conveyor. In contrast, if these same wafers were vertically oriented with a 1 cm gap on a continuous conveyor, processing of 11 wafers/min (or 1100 cm²/min) can be achieved. By eliminating the boats, embodiments of the present invention can take advantage of the benefits of vertical wafer processing without the need for complex mechanisms or manual returns associated with boats. This also simplifies the loading/unloading automation of the furnace.

Figure 1A:
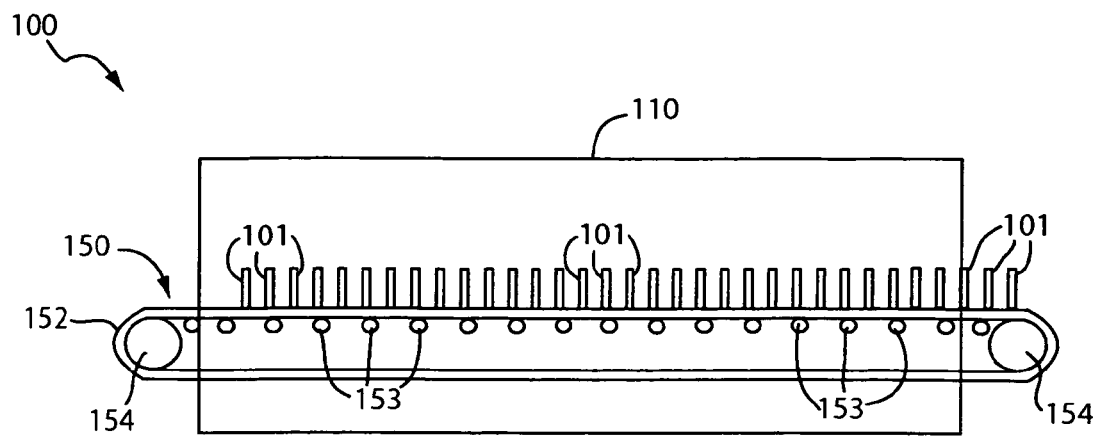
FIG. 1(a) schematically shows a side view of an in-line furnace in accordance with an embodiment of the present invention.

FIG. 1(a) schematically shows a side view of an in-line furnace 100 in accordance with an embodiment of the present invention. In the example of FIG. 1(a), the furnace 100 includes a processing chamber 110 and a transport mechanism 150. The transport mechanism 150 may include a drive mechanism 154 and a conveyor 152. A plurality of conveyor supports 153 supports the conveyor 152 and prevents it from sagging. In one embodiment, the conveyor supports 153 comprise rollers placed underneath the conveyor 152. A continuous rolling or non-rolling conveyor support may also be used without detracting from the merits of the present invention.

The conveyor 152 provides a continuously rotating platform on which a plurality of wafers 101 may be placed. As will be more apparent below, the conveyor 152 may include integrated wafer retainers that may support wafers 101 vertically or at an angle (i.e., greater than zero degree) relative to the ground (and the conveyor 152 as in FIG. 1(a)). In the example of FIG. 1(a), the conveyor 152 loops forward and backward within the chamber 110. In other embodiments, the conveyor 152 may loop in one direction through the interior of the chamber 110 and return outside the chamber 110. In embodiments where the conveyor 152 loops outside the chamber 110, the portion of the conveyor 152 outside the chamber 110 may run through a chase to protect the conveyor 152 and the wafers it carries from contamination. The conveyor 152 may extend beyond the chamber 110 or enclosed within the chamber 110. In either case, a human operator or automation equipment may load an unprocessed wafer 101 on a loading end of the chamber 110 and pick up a processed wafer 101 on the pick-up end of the chamber 110. The chamber 110 may perform thermal processing on the wafer 101, such diffusion or annealing, for example. Only some of the wafers 101 and conveyor supports 153 are labeled in FIG. 1(a) for clarity of illustration.

In operation, wafers 101 to be processed may be placed on the conveyor 152 on the loading end of the chamber 110. The drive mechanism 154 rotates the conveyor 152 in a direction toward the pick-up end of the chamber 110. This moves the wafers 101 into the chamber 110 where the wafers 101 are heated for thermal processing. Processed wafers 101 emerge on the pick-up end of the chamber 110 for pick-up.

Figure 1B:
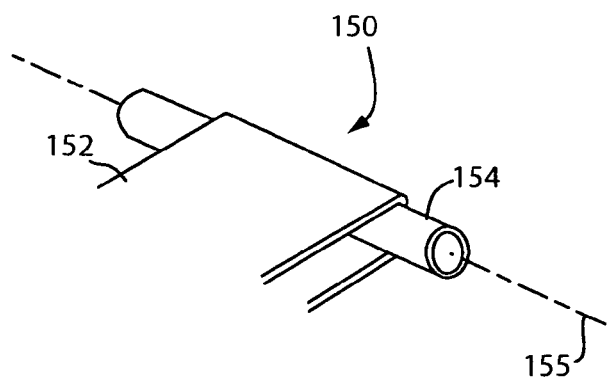
FIG. 1(b) schematically shows a perspective view of a conveyor of a transport mechanism in the furnace of FIG. 1(a).

FIG. 1(b) schematically shows a perspective view of the conveyor 152 in relation to the drive mechanism 154 in one embodiment of the present invention. The drive mechanism 154 may comprise a cylinder with gears rotated by a motor (not shown) on an axis 155, for example. The drive mechanism 154 may also include other components, such as idlers. Other ways of driving the conveyor 152 may also be used without detracting from the merits of the present invention.

The conveyor 152 may be made of a low impurity level material that will not degrade the properties of the wafers being processed, such as quartz or silicon carbide (SiC). In one embodiment, the conveyor 152 comprises a plurality of rigid segments that are joined together to allow a continuous conveyor 152 to flex in at least one direction. The conveyor 152 may include integrated wafer retainers that hold wafers at an angle relative to the ground or the conveyor's plane of travel. The conveyor 152 may be implemented as a belt, chain, or other type of conveyors.

Figure 2A:
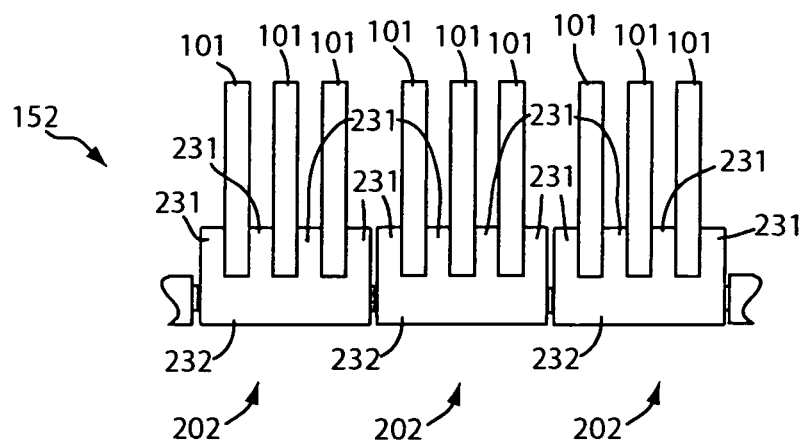
FIG. 2(a) is a side view schematically showing a conveyor in accordance with an embodiment of the present invention.

FIG. 2(a) is a side view schematically showing further details of the conveyor 152 in accordance with an embodiment of the present invention. In the example of FIG. 2(a), the conveyor 152 comprises a plurality of segments 202 that are joined together to form a continuous loop. Each segment 202 may include a base 232 and a plurality of wafer retainers 231. The wafer retainers 231 may form slots for holding wafers 101, which in the example of FIG. 2(a) are vertical relative to the base 232. In general, the wafer retainers 231 hold the wafers 101 vertically or at an angle relative to the ground. This increases wafer density inside the chamber 110 and allows the transport mechanism 150 to travel slower for the same wafer throughput compared to furnaces where wafers are laid horizontally flat on conveyors. Advantageously, the chamber 110 may be made shorter and thus at a lower cost compared to conventional furnaces. The orientation of the wafers 101 on the conveyor 152 also minimizes wafer contact with the transport mechanism 150. Elimination of wafer boats on the conveyor 152 simplifies wafer processing operations using the furnace 100, thus reducing the cost of processing the wafers 101.

Figure 2B:
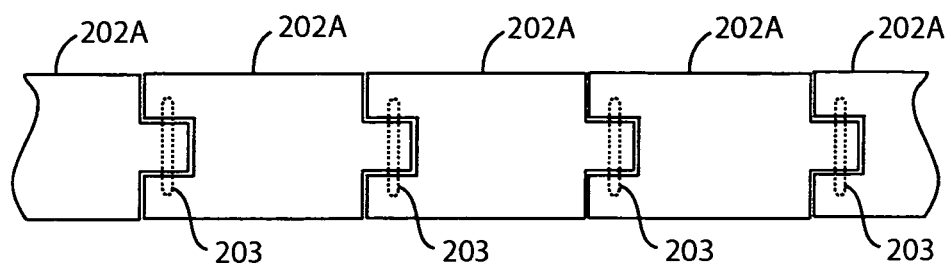
FIGS. 2(b) and 2(c) are top views schematically showing how segments of a conveyor may be joined together in accordance with embodiments of the present invention.
Figure 2C:
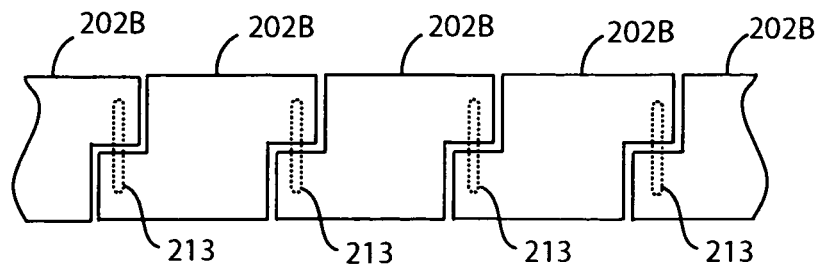

FIGS. 2(b) and 2(c) are top views schematically showing how segments of a conveyor may be joined in accordance with embodiments of the present invention. Wafer retainers are not shown in FIGS. 2(b) and 2(c) for clarity of illustration. In the example of FIG. 2(b), the conveyor comprises a plurality of segments 202A, which are joined together by pins 203. Each segment 202A has a centrally located tab on one end and a centrally located cutout on the other. A tab of one segment 202A fits into the cutout of another to form a continuous conveyor. In the example of FIG. 2(c), each segment 202B has an offset tab on each end. The tabs of the segments 202B may be joined together by pins 213 to form a continuous conveyor. Other segment shapes and ways of joining them to form a continuous, flexible conveyor may also be used without detracting from the merits of the present invention.

FIGS. 3(a), 3(b), 3(c), 3(d), and 3(e) schematically show front views of conveyors in accordance with embodiments of the present invention. In one embodiment, a wafer 101 comprises a semiconductor wafer with substantially straight edges that may be supported along the length of a wafer retainer. Preferably, a wafer 101 comprises a square or semi-square wafer that has at least two straight edges at a fixed angle, such as those used for solar cells.

Figure 3A:
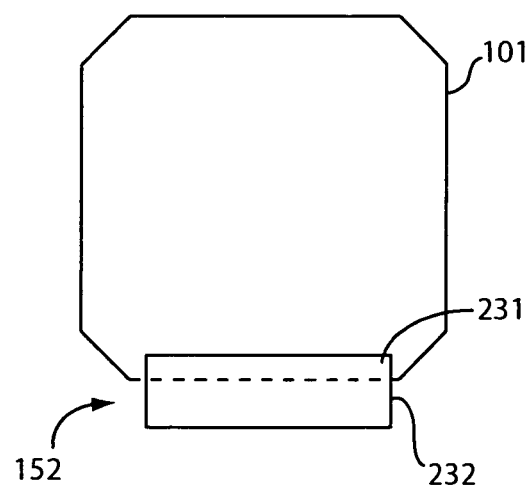
FIGS. 3(a), 3(b), 3(c), 3(d) and 3(e) schematically show front views of conveyors in accordance with embodiments of the present invention.

In FIG. 3(a), the wafer 101 is mounted vertically on the conveyor 152, with one of its straight edges resting on the base 232 (see also FIG. 2(a)). Wafer retainers 231 on the front and back surfaces of the wafer 101 secure the wafer 101 on the conveyor 152. A single conveyor 152 is shown in FIG. 3(a), but two coplanar conveyors 152 that travel in unison in the same direction may also be used.

Figure 3B:
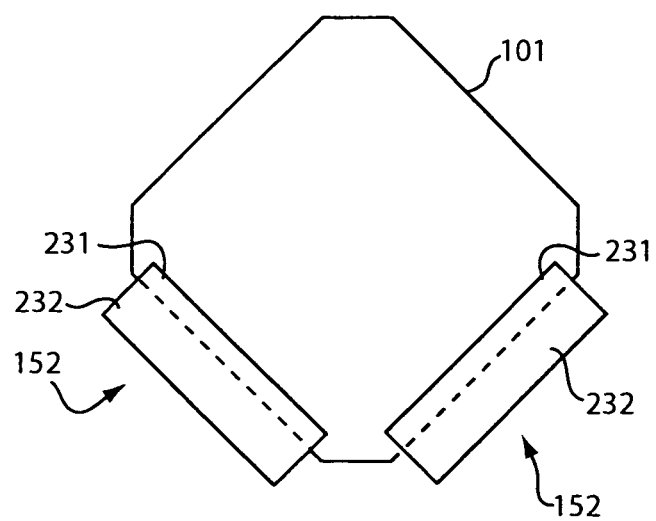

In FIG. 3(b), the wafer 101 is still mounted vertically relative to the ground but is now supported by two conveyors 152 that are at a fixed angle (e.g., 90 degrees) relative to one another. This configuration prevents lateral (side to side) movement of the wafer 101, and thus stabilizes the wafer 101 more securely compared to a single conveyor or two coplanar conveyors. The two conveyors 152 travel in unison in the same direction to move the wafer 101 through the furnace.

Figure 3C:
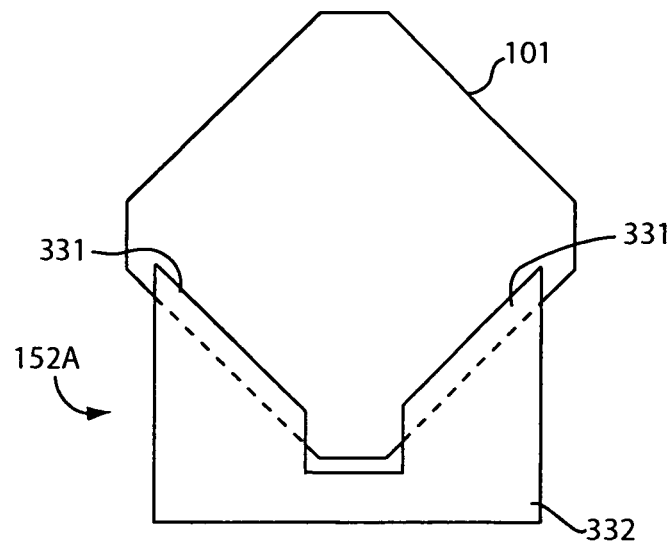

In FIG. 3(c), the conveyor 152A has wafer retainers 331 formed at a fixed angle relative to one another. The straight edges of the wafer 101 rest on slots formed by wafer retainers 331 on the front and back surfaces of the wafer 101. The embodiment of FIG. 3(c) is the same as that of FIG. 3(b) except that the wafer retainers 331 share the same base 332. This advantageously allows the use of a single conveyor 152A in the furnace, while still preventing lateral movement of the wafer 101.

Figure 3D:
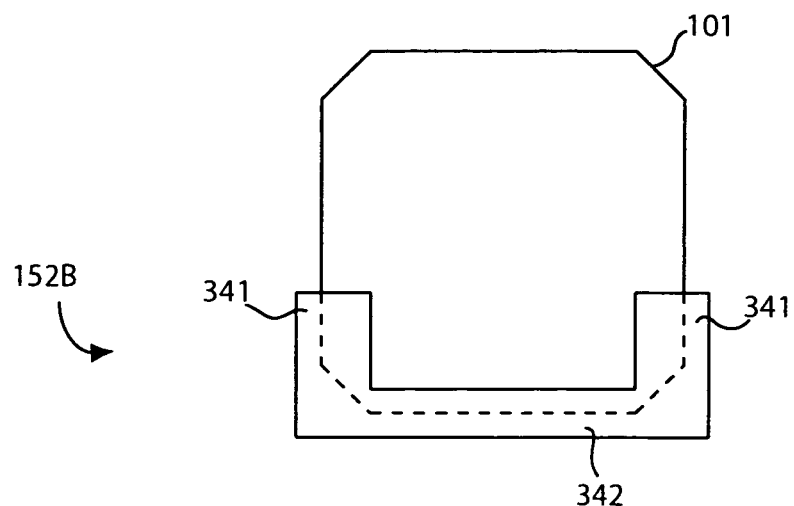

In FIG. 3(d), the conveyor 152B has wafer retainers 341 that have significant vertical relief to provide even more lateral support to the wafer 101 even when using a single conveyor. In the embodiment of FIG. 3(d), the wafer retainers 341 are formed at the edges of the base 342 and are perpendicular thereto. The straight edges of the wafer 101 rest on slots formed by the wafer retainers 341 on the front and back surfaces of the wafer 101.

Figure 3E:
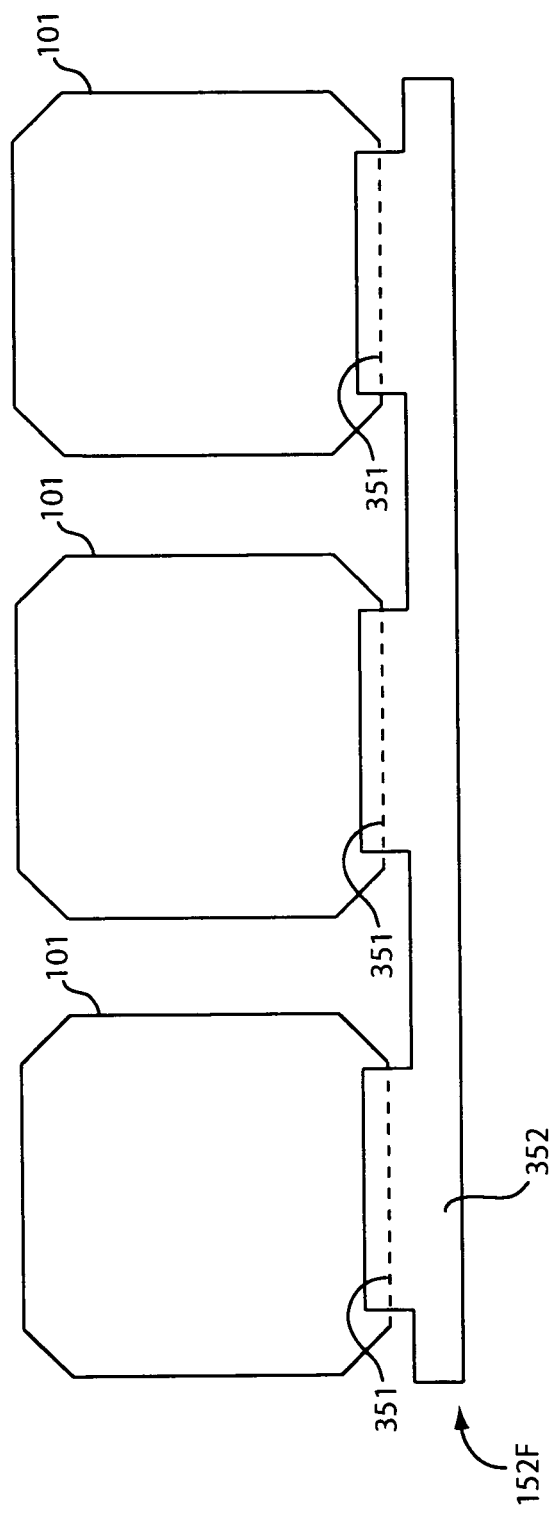

For increased throughput, a conveyor may include several lanes of wafer retainers per row. In FIG. 3(e), the conveyor 152F has several (three in the example) wafer retainers 351 on a base 352. The straight edges of the wafers 101 rest on slots formed by the wafer retainers 351 on the front and back surfaces of the wafers 101, and substantially line up to form a row of wafers. The conveyor 152F is configured to support several wafers 101 side by side in a row.

Wafer retainers may be integrated with the conveyor by forming relatively thick segments and then cutting slots in the segments. In that embodiment, the wafer retainers and their base form a single-piece segment. In another embodiment, the wafer retainers are fabricated separately from their base. The wafer retainers may then be integrated with the conveyor by fixedly attaching (either permanently or removably) them to their base to form a multi-piece segment. If the wafer retainers are not permanently fixedly attached, the wafer retainers may be replaced without having to replace the base. In any event, the wafer retainers are integrated with the conveyor in that unlike wafer boats, the wafer retainers are not removable from the conveyor during normal operation. Wafer retainers are preferably configured to contact as little of the wafer as possible to minimize contamination and to expose more of the wafer for processing.

Figure 4B:
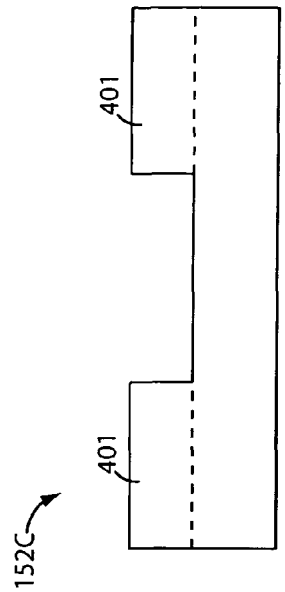
FIGS. 4(a), 4(b), 5(a), 5(b), 6(a), and 6(b) schematically show various views of conveyors in accordance with embodiments of the present invention.
Figure 4A:
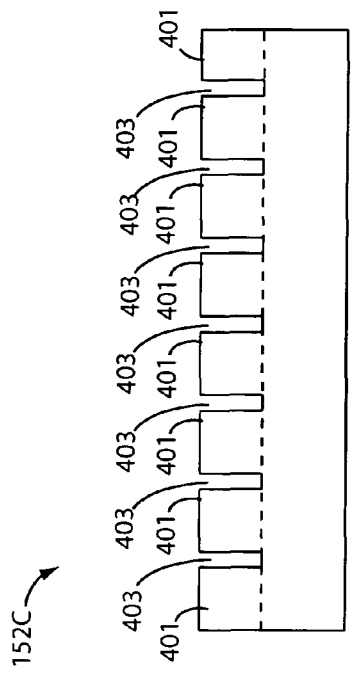

FIGS. 4(a) and 4(b) schematically show a side view and a front view, respectively, of a conveyor 152C in accordance with an embodiment of the present invention. In the example of FIG. 4(a), wafer retainers 401 form slots 403 into which wafers may be inserted. As shown in FIG. 4(b), the conveyor 152C may have two or more wafer retainers 401 to support each surface of the wafer.

Figure 5B:
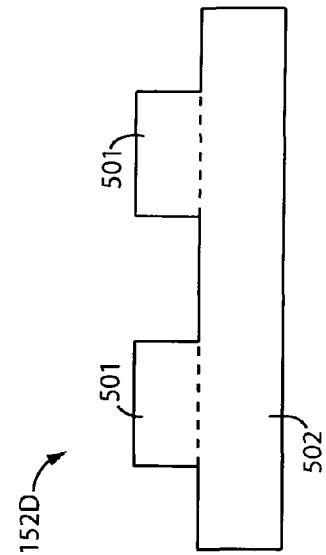
Figure 5A:
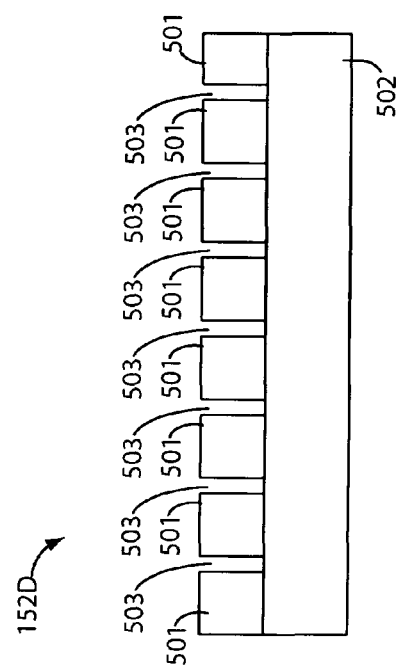

FIGS. 5(a) and 5(b) schematically show a side view and a front view, respectively, of a conveyor 152D in accordance with an embodiment of the present invention. In this embodiment, wafer retainers 501 form slots 503 into which wafers may be inserted. As shown in FIG. 5(b), the conveyor 152D is similar to the conveyor 152C except that the two or more wafer retainers 501 supporting each surface of the wafer are not on the edges of the conveyor.

Figure 6B:
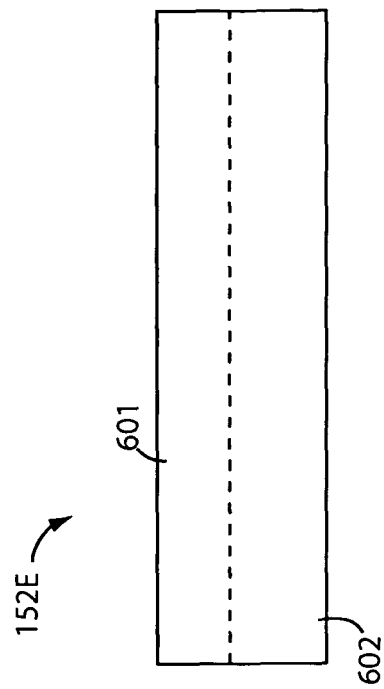
Figure 6A:
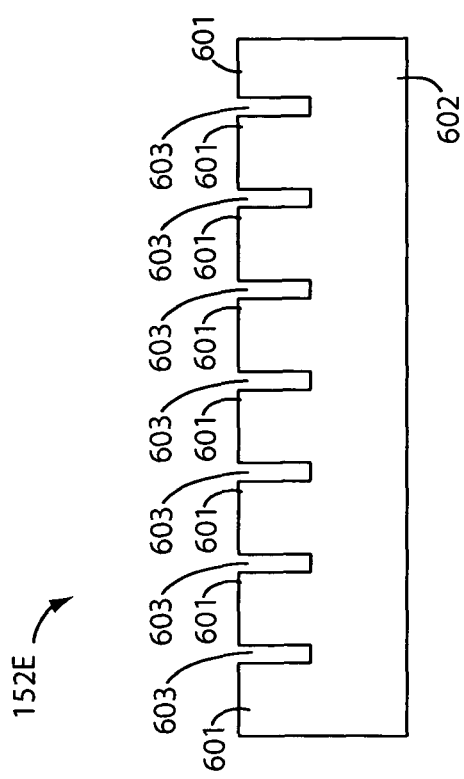

FIGS. 6(a) and 6(b) schematically show a side view and a front view, respectively, of a conveyor 152E in accordance with an embodiment of the present invention. In this embodiment, wafer retainers 601 form slots 603 into which wafers may be inserted. Unlike those in conveyors 152C and 152D, the wafer retainers 601 in conveyor 152C span the width of the conveyor.

Figure 7:
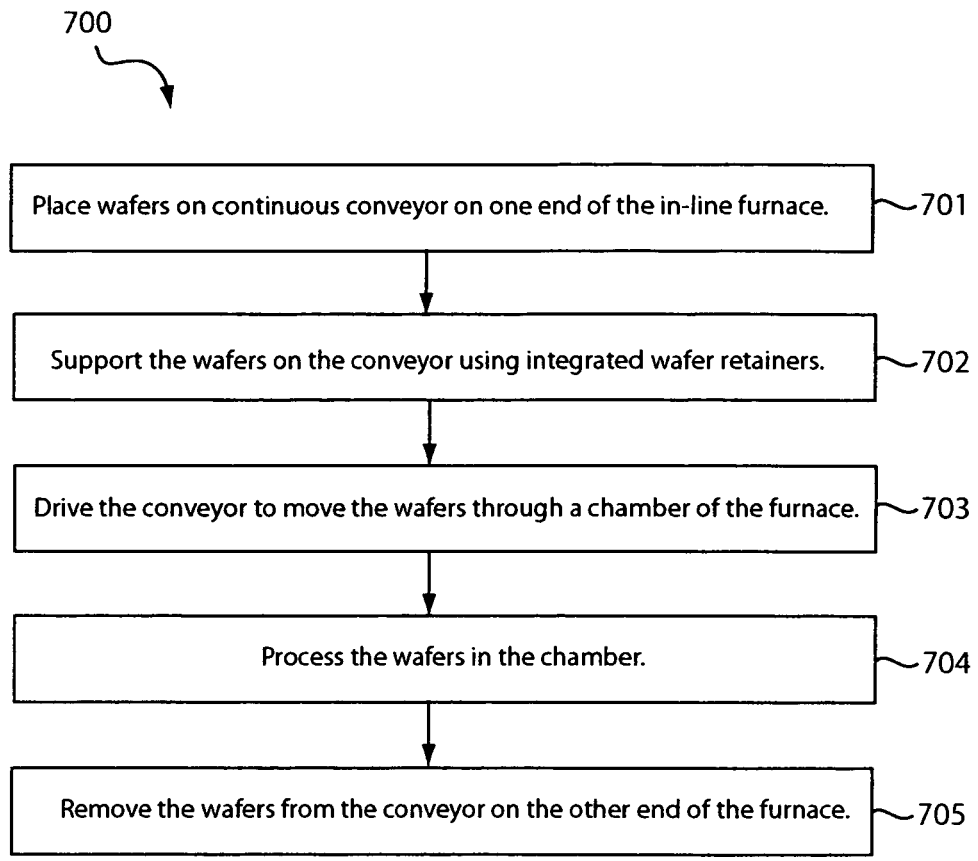
FIG. 7 shows a flow diagram of a method of processing a wafer in an in-line furnace in accordance with an embodiment of the present invention.

Turning now to FIG. 7, there is shown a flow diagram of a method 700 of processing a wafer in an in-line furnace chamber, such as an in-line process tube, in accordance with an embodiment of the present invention.

In step 701, a plurality of wafers is placed on a continuous conveyor on one end of the furnace.

In step 702, the wafers are supported by wafer retainers at an angle (e.g., 90 degrees) relative to ground. The wafer retainers may be fixedly (either removably or permanently) integrated with the conveyor. In one embodiment, the wafer retainers are formed on a base, with the wafer retainers and the base forming a segment that is joined with other segments to form the conveyor. The integrated wafer retainers advantageously allow thermal processing of the wafers without having to use wafer boats.

In step 703, the conveyor is driven to move the wafers through a chamber of the furnace.

In step 704, the wafers are processed in the chamber. The processing of the wafers may involve diffusion, annealing, cooling, doping, and other processing suitably performed in a process tube.

In step 705, the wafers are removed from the conveyor on the other end of the furnace.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. An in-line furnace comprising:
   a continuous first conveyor configured to hold a plurality of wafers without using a removable wafer boat to contain the wafers, the first conveyor including integrated wafer retainers configured to secure each of the wafers at an angle relative to ground; and
   a chamber configured to thermally process the wafers as the first conveyor moves the wafers through the chamber.

2. The in-line furnace of claim 1 further comprising:
   a continuous second conveyor configured to hold and move the wafers with the first conveyor, the first and second conveyors holding the wafers at straight edges of the wafers.

3. The in-line furnace of claim 2 wherein the first and second conveyors are at an angle relative to one another.

4. The in-line furnace of claim 1 wherein the first conveyor supports the wafers at straight edges of the wafers.

5. The in-line furnace of claim 1 wherein the in-line furnace is a diffusion or annealing furnace.

6. The in-line furnace of claim 1 wherein the first conveyor loops within the chamber.

7. The in-line furnace of claim 1 wherein the first conveyor comprises a plurality of segments that are joined together.

\* \* \* \* \*